(12) United States Patent
Zhou et al.

(10) Patent No.: US 11,880,602 B2
(45) Date of Patent: Jan. 23, 2024

(54) DATA WRITING METHOD AND STORAGE DEVICE

(71) Applicant: Huawei Technologies Co., Ltd., Shenzhen (CN)

(72) Inventors: Meng Zhou, Shenzhen (CN); Jianhua Zhou, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/562,783

(22) Filed: Dec. 27, 2021

(65) Prior Publication Data

US 2022/0121400 A1 Apr. 21, 2022

Related U.S. Application Data

(63) Continuation of application No. 16/854,109, filed on Apr. 21, 2020, now Pat. No. 11,237,765, which is a (Continued)

(30) Foreign Application Priority Data

Oct. 25, 2017 (CN) .......................... 201711007552.5

(51) Int. Cl.
G06F 3/00 (2006.01)
G06F 3/06 (2006.01)
(Continued)

(52) U.S. Cl.
CPC .......... G06F 3/0659 (2013.01); G06F 3/0604 (2013.01); G06F 3/0673 (2013.01);
(Continued)

(58) Field of Classification Search
CPC . G11C 16/10; G11C 11/5628; G11C 16/0483; G11C 2029/0411; G11C 29/08; G11C 29/42; G11C 29/52; G06F 3/0679; G06F 3/061; G06F 3/0604; G06F 3/064; G06F 3/0659; G06F 12/0246;
(Continued)

(56) References Cited

U.S. PATENT DOCUMENTS 9,489,263 B2 * 11/2016 Hyun ..................... G11C 29/52
10,503,406 B2 * 12/2019 Kang .................... G06F 3/0605
(Continued)

FOREIGN PATENT DOCUMENTS

CN 103019882 A 4/2013
CN 103176753 A 6/2013
(Continued)

Primary Examiner — Thong Q Le
(74) Attorney, Agent, or Firm — Conley Rose, P.C.

(57) ABSTRACT

A data writing method includes: receiving a write command, where the write command carries a type of to-be-written data; determining, based on the type of to-be-written data, a type of storage area that is in an SSD and into which the to-be-written data is written, where the SSD includes a plurality of types of storage areas; determining, based on the type of storage area, a target storage area into which the to-be-written data is written; and writing the to-be-written data into the target storage area. In embodiments of this application, data processing efficiency can be improved.

24 Claims, 11 Drawing Sheets

Related U.S. Application Data continuation of application No. PCT/CN2018/107798, filed on Sep. 27, 2018.

(51) Int. Cl.
  *G11C 11/56* (2006.01)
  *G11C 16/10* (2006.01)
  *G11C 16/04* (2006.01)
  *H01L 29/788* (2006.01)

(52) U.S. Cl.
  CPC .......... *G11C 11/5628* (2013.01); *G11C 16/10* (2013.01); *G11C 16/0483* (2013.01); *H01L 29/788* (2013.01)

(58) Field of Classification Search
  CPC .... G06F 3/0673; G06F 3/0644; G06F 3/0616; G06F 2212/7205; G06F 2212/7208; G06F 3/0605; G06F 3/0632; G06F 3/0688; G06F 1/1643; G06F 1/1647; G06F 11/1068; G06F 11/2015; G06F 12/1009; G06F 2203/04104; G06F 2203/04105; G06F 2203/04808; G06F 2212/7201; G06F 3/013; G06F 3/016; G06F 3/041; G06F 3/0412; G06F 3/0414; G06F 3/0416; G06F 3/044; G06F 3/045; G06F 3/048; G06F 3/04815; G06F 3/04817; G06F 3/0482; G06F 3/04845; G06F 3/04883; G06F 3/04886; G06F 3/0619; G06F 3/0631; G06F 3/0638; G06F 9/4843; G06F 1/30; G06F 11/00; G06F 11/1076; G06F 11/108; G06F 11/1441; G06F 11/1471; G06F 11/3058; G06F 11/3062; G06F 12/0253; G06F 12/0638; G06F 12/0882; G06F 12/0891; G06F 12/1027; G06F 13/1673; G06F 2211/109; G06F 2212/1016; G06F 2212/1032; G06F 2212/1036; G06F 2212/7203; G06F 2212/7209; G06F 3/0607; G06F 3/0614; G06F 3/0625; G06F 3/0629; G06F 3/0649; G06F 3/0652; G06F 3/0653; G06F 3/0655; G06F 3/0658; G06F 3/068; G06F 3/0685; G06F 9/4418; H01L 29/788

See application file for complete search history.

(56) References Cited

U.S. PATENT DOCUMENTS

| | | |
|---|---|---|
| 2009/0049234 A1 | 2/2009 | Oh et al. |
| 2014/0181452 A1 | 6/2014 | Malladi et al. |
| 2015/0193299 A1 | 7/2015 | Hyun et al. |
| 2017/0177258 A1 | 6/2017 | Bates et al. |
| 2018/0277173 A1 | 9/2018 | Takizawa et al. |

FOREIGN PATENT DOCUMENTS

| | | |
|---|---|---|
| CN | 103714010 A | 4/2014 |
| CN | 104881259 A | 9/2015 |
| CN | 105094695 A | 11/2015 |
| CN | 105867839 A | 8/2016 |
| CN | 106055504 A | 10/2016 |
| CN | 107967121 A | 4/2018 |

* cited by examiner

|       | Shared page |      |      | Shared page |     |     | Shared page |     |     | Shared page |     |     |
|-------|-----|------|------|-----|-----|-----|-----|-----|-----|-----|-----|-----|
| LSB ← | 0   | -    | -    | 1   | -   | -   | 2   | -   | -   | 3   | -   | -   |
|       | 4   | -    | -    | 5   | -   | -   | 6   | -   | -   | 7   | -   | -   |
|       | 8   | -    | -    | 9   | -   | -   | 10  | -   | -   | 11  | -   | -   |
|       | 12  | -    | -    | 13  | -   | -   | 14  | -   | -   | 15  | -   | -   |
| CSB ← | 16  | 17   | -    | 18  | 19  | -   | 20  | 21  | -   | 22  | 23  | -   |
|       | 24  | 25   | -    | 26  | 27  | -   | 28  | 29  | -   | 30  | 31  | -   |
|       | 32  | 33   | -    | 34  | 35  | -   | 36  | 37  | -   | 38  | 39  | -   |
|       | 40  | 41   | -    | 42  | 43  | -   | 44  | 45  | -   | 46  | 47  | -   |
| MSB ← | 48  | 49   | 112  | 50  | 51  | 115 | 52  | 53  | 118 | 54  | 55  | 121 |
|       | 56  | 57   | 124  | 58  | 59  | 127 | 60  | 61  | 130 | 62  | 63  | 133 |
|       | 64  | 65   | 136  | 66  | 67  | 139 | 68  | 69  | 142 | 70  | 71  | 145 |
|       | 72  | 73   | 148  | 74  | 75  | 151 | 76  | 77  | 154 | 78  | 79  | 157 |
|       | 80  | 81   | 160  | 82  | 83  | 163 | 84  | 85  | 166 | 86  | 87  | 169 |
|       | 88  | 89   | 172  | 90  | 91  | 175 | 92  | 93  | 178 | 94  | 95  | 181 |
|       | 96  | 97   | 184  | 98  | 99  | 187 | 100 | 101 | 190 | 102 | 103 | 193 |
|       | 104 | 105  | 196  | 106 | 107 | 199 | 108 | 109 | 202 | 110 | 111 | 205 |
|       | 113 | 114  | 208  | 116 | 117 | 211 | 119 | 120 | 214 | 122 | 123 | 217 |
|       | 125 | 126  | 220  | 128 | 129 | 223 | 131 | 132 | 226 | 134 | 135 | 229 |
|       | 137 | 138  | 232  | 140 | 141 | 235 | 143 | 144 | 238 | 146 | 147 | 241 |
|       | 149 | 150  | 244  | 152 | 153 | 247 | 155 | 156 | 250 | 158 | 159 | 253 |

FIG. 5

| Value of a bit | Latency information |
|---|---|
| 00b | No latency information provided |
| 01b | Longer latency acceptable |
| 10b | Typical latency |
| 11b | Smallest possible latency |

DATA WRITING METHOD AND STORAGE DEVICE

CROSS-REFERENCE TO RELATED APPLICATIONS

This is a continuation of U.S. patent Ser. No. 16/854,109, filed on Apr. 21, 2020, which is a continuation of Int'l Patent App. No. PCT/CN2018/107798, filed on Sep. 27, 2018, which claims priority to Chinese Patent App. No. 201711007552.5, filed on Oct. 25, 2017, all of which are incorporated by reference.

FIELD

This disclosure relates to the computer field, and more specifically, to a data writing method and a storage device.

BACKGROUND

With continuous development of storage technologies, a solid-state drive (SSD) that uses a not and (NAND) flash as a storage medium gradually becomes a mainstream storage form. The NAND flash is a non-volatile, random-access storage medium, and a feature of the storage medium is that data is not lost after power-off.

Currently, the NAND flash stores data in a plurality of blocks based on a receiving sequence, to improve concurrency. The data is randomly stored in each page in the blocks. However, different pages have different data storage performance. For example, pages may be classified into three types: a least significant bit (LSB) page, a central significant bit (CSB) page, or a most significant bit (MSB) page. In addition, performance of the LSB page, the CSB page, and the MSB page sequentially decreases.

Therefore, in a current storage method, a storage device is less efficient at storing data of applications with different processing requirements.

SUMMARY

This disclosure provides a data writing method and a storage device, to improve data processing efficiency.

According to a first aspect, a data writing method is provided. The method includes: receiving a write command, where the write command carries a type of to-be-written data; determining, based on the type of to-be-written data, a type of storage area that is in an SSD and into which the to-be-written data is written, where the SSD includes a plurality of types of storage areas; determining, based on the type of storage area, a target storage area into which the to-be-written data is written; and writing the to-be-written data into the target storage area.

A storage device receives the write command that carries the type of to-be-written data, determines, based on the type of to-be-written data, the type of storage area into which the to-be-written data is written, and then determines, based on the type of storage area, the target storage area into which the to-be-written data is written. In this way, the storage device can store the data in a proper storage area. In other words, the storage device can meet different requirements of applications. Therefore, data processing efficiency and system performance are improved.

In some possible implementations, the SSD stores a correspondence between a data type and a storage area type, and the determining, based on the type of to-be-written data, a type of storage area that is in an SSD and into which the to-be-written data is written includes: determining, based on the type of to-be-written data and the correspondence, a type of target storage area into which the to-be-written data is written.

The storage device can determine, based on the correspondence between the data type and the storage area type and the type of to-be-written data, the type of target storage area into which the to-be-written data is written. In this way, efficiency of writing data into the storage device is further improved.

In some possible implementations, the SSD includes a plurality of storage blocks, the SSD is divided into different types of storage areas based on types of the storage blocks, and the correspondence is a correspondence between the data type and a storage block type.

The storage device can determine, based on the correspondence between the data type and the storage block type and the type of to-be-written data, a type of target storage block into which the to-be-written data is written. In this way, efficiency of writing data into the storage device and reliability of data writing can be improved.

In some possible implementations, the SSD includes a plurality of storage blocks, each storage block includes at least one type of storage page, the SSD is divided into different types of storage areas based on storage page types, and the correspondence is a correspondence between the data type and the storage page type.

The storage device can determine, based on the correspondence between the data type and the storage page type and the type of to-be-written data, a type of target storage page into which the to-be-written data is written. In this way, at least one of a read latency, a write latency, and read/write reliability can be improved.

In some possible implementations, different types of each storage pages are corresponding to one storage list, and each storage list records one type of storage page; and the determining, based on the type of storage area, a target storage area into which the to-be-written data is written includes: finding, based on a storage page type, an available storage page in a storage list corresponding to the storage page type, and using the available storage page as the target storage area; and if there is an available storage page in the storage list, using the available storage page as the target storage area; or if there is no available storage page in the storage list, obtaining an idle storage block in the SSD, and using a first storage page in the idle storage block as the target storage area.

The storage device may be compatible with a conventional solution in which a writing method of writing data into a block based on a page sequence is used. In this case, reliability of writing data into the storage device is improved while compatibility with the conventional solution is implemented.

In some possible implementations, the SSD includes at least two of a single-level cell (SLC) area, a multi-level cell (MLC) area, a triple-level cell (TLC) area, and a quad-level cell (QLC) area, performance of the SLC area, the MLC area, the TLC area, and the QLC area sequentially decreases, and before the determining, based on the type of storage area, a target storage area into which the to-be-written data is written, the method further includes: if there is no idle storage page in all storage blocks in a storage area corresponding to the type of storage area that is in the SSD and into which the to-be-written data is written, converting a type of at least one block that includes an idle storage page and that is in a storage area having lower performance than the type of storage area that is in the SSD and into which the to-be-written data is written to a type that is the same as a type of storage area of the type of storage area that is in the SSD and into which the to-be-written data is written.

In the storage device, if there is no block that includes an available idle page in the storage area of the type of storage area that is in the SSD and into which the to-be-written data is written, the storage device may convert a block in the MLC area, the TLC area, or the QLC area to a block in the SLC area. To be specific, the storage device may convert a block in a storage area having low performance to a block in a storage area having higher performance. In this way, a waste of an idle resource in the storage area with a high-performance priority is avoided, and resource utilization of the storage device is improved.

In some possible implementations, the storage block includes at least two of an LSB page, a CSB page, and the MSB page, performance of the LSB page, the CSB page, and the MSB page sequentially decreases, and the determining, based on the type of storage area, a target storage area into which the to-be-written data is written includes: if a storage area of the type of storage area that is in the SSD and into which the to-be-written data is written is the MSB page or the CSB page, and there is no available storage page in the storage area of the type of storage area that is in the SSD and into which the to-be-written data is written, determining, as the target storage area, at least one available storage page having higher performance than the type of storage area that is in the SSD and into which the to-be-written data is written.

When there is no available idle page in pages corresponding to a page type having low performance, the storage device may determine an available idle page having higher performance as the target storage area. In this way, a waste of an idle resource in the available page having higher performance is avoided, and resource utilization of the storage device is improved.

According to a second aspect, a storage device is provided. The storage device includes a module configured to perform the method in the first aspect or any possible implementation of the first aspect.

According to a third aspect, a storage device is provided. The storage device includes a processor, a memory, and a communications interface. The processor is connected to the memory and the communications interface. The memory is configured to store an instruction, the processor is configured to execute the instruction, and the communications interface is configured to communicate with another network element under control of the processor. When the processor executes the instruction stored in the memory, the processor performs the method in the first aspect or any possible implementation of the first aspect.

According to a fourth aspect, a computer storage medium is provided. The computer storage medium stores program code, and the program code is used to indicate an instruction used to perform the method in the first aspect or any possible implementation of the first aspect.

According to a fifth aspect, a system chip is provided. The system chip includes an input/output interface, at least one processor, at least one memory, and a bus. The at least one memory is configured to store an instruction, and the at least one processor is configured to invoke the instruction in the at least one memory to perform an operation in the method in the foregoing aspects.

Based on the foregoing solution, the storage device receives the write command that carries the type of to-be-written data, determines, based on the type of to-be-written data, the type of storage area into which the to-be-written data is written, and then determines, based on the type of storage area, the target storage area into which the to-be-written data is written. In this way, the storage device can store the data in a proper storage area. In other words, the storage device can meet different requirements of applications. Therefore, data processing efficiency and system performance are improved.

BRIEF DESCRIPTION OF THE DRAWINGS

FIG. 5 is a schematic diagram of a sharing relationship between pages in a block.

DETAILED DESCRIPTION

The following describes technical solutions with reference to accompanying drawings.

With continuous development of storage technologies, an SSD that uses a NAND flash as a storage medium gradually becomes a mainstream storage form. The NAND flash is a non-volatile random access storage medium and has features: no data loss after power-off, a large capacity, a fast reading/writing rate, and applicability to massive data storage. Compared with performance of a conventional hard disk drive (HDD) that uses a magnetic medium, there is a qualitative leap in performance of the SSD. Specifically, the SSD can process hundreds of thousands of commands per second.

Figure 1:
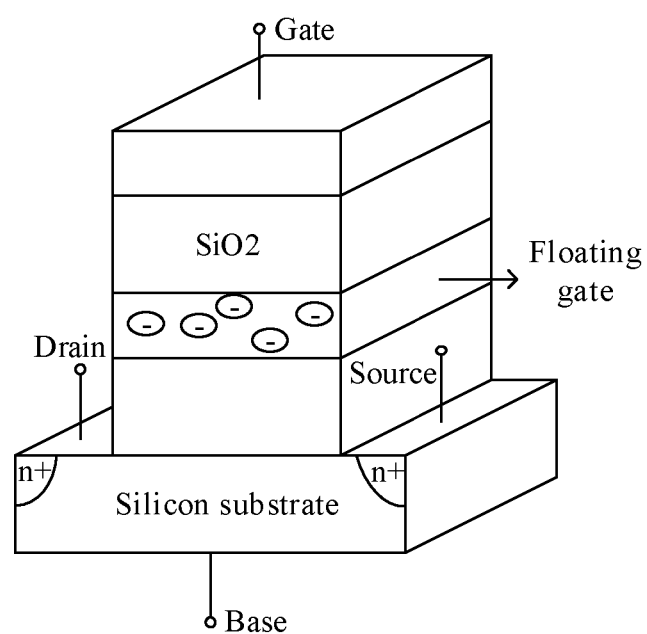
FIG. 1 is a schematic structural diagram of a floating gate transistor.

Currently, a mainstream NAND flash is designed based on a floating gate transistor. A floating gate is configured to hold a charge. In this way, the charge is stored in the floating gate, and the charge can still be kept without a power supply. FIG. 1 is a schematic diagram of a basic structure of a floating gate transistor. As shown in FIG. 1, a NAND flash is designed as a dual-gate transistor, and includes a source, a drain, a gate, a floating gate, a silicon substrate, and an insulation layer. The floating gate is located between the gate and the silicon substrate and is separated from the silicon substrate by the insulation layer. The insulation layer may include oxygen-nitrogen-oxygen or silicon dioxide ($SiO_2$). A charge potential well that stores a charge may be formed in the floating gate transistor. The floating gate records information by holding a charge.

The floating gate transistor may obtain a threshold voltage of the transistor based on whether the floating gate stores a charge or a quantity of stored charges, and indicate data information by using the obtained threshold voltage of the transistor. One floating gate transistor is corresponding to one cell of the NAND flash. A process of writing data into the cell (that is, a programming process) is a process of injecting a charge into the charge potential well. The NAND flash charges the floating gate through Fowler-Nordheim (F-N) tunneling by using the silicon substrate. However, before programming is performed on the NAND flash, original data needs to be erased. An erasing process is to release a charge in the floating gate through the F-N tunneling.

After the data in the NAND flash is erased, there is no charge in the cell, and a read threshold voltage is a low level. For example, the low level may be represented by data of "1". After the programming is performed, a charge is injected into the cell, and a read threshold voltage is a high level, and the high level may be represented by data of "0".

Figure 2:
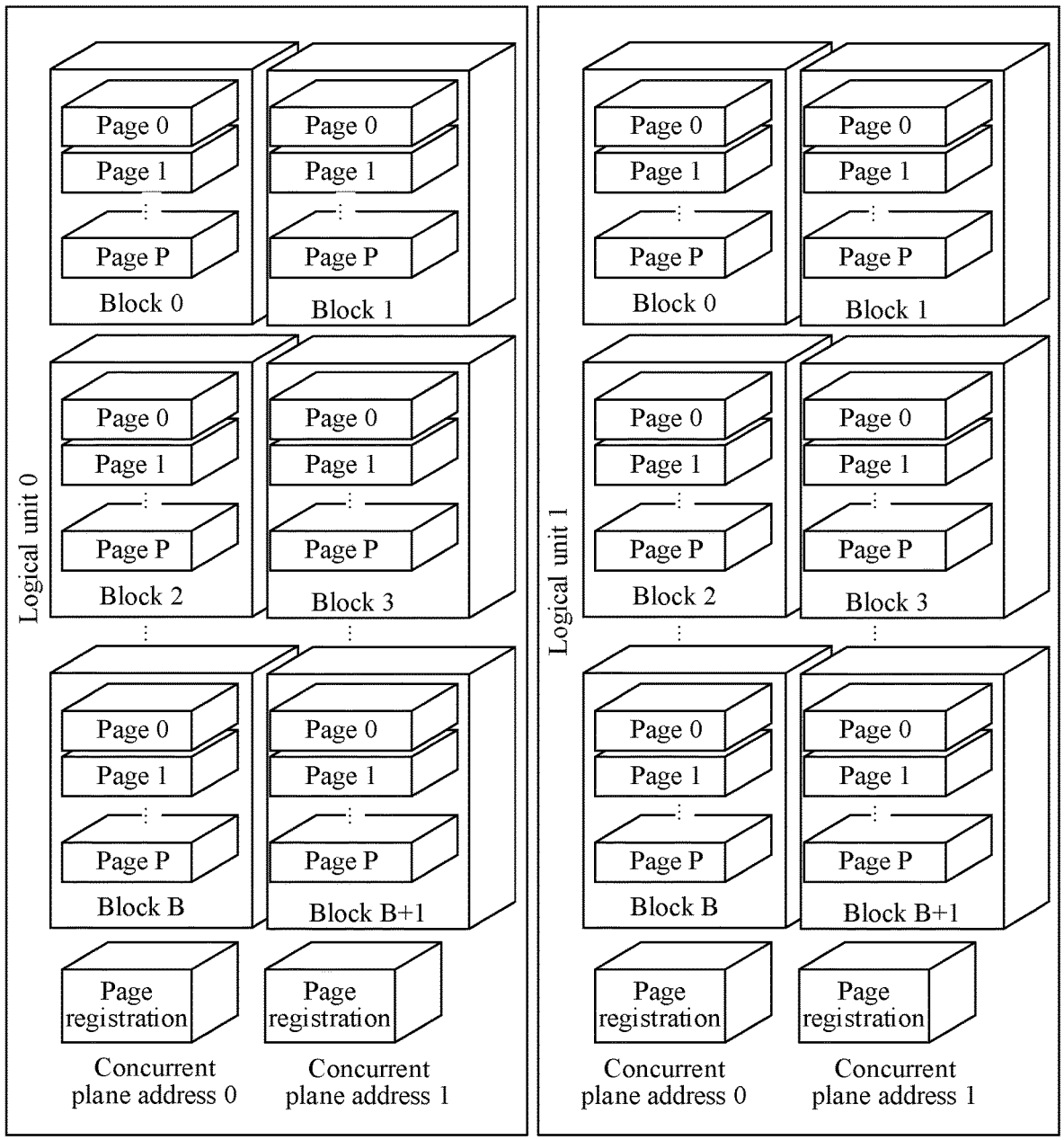
FIG. 2 is a schematic structural diagram of a logical unit number (LUN).

A block is a minimum unit that is in the NAND flash and on which an erasing operation can be performed, and usually includes a plurality of pages. A page is a minimum unit on which a programming operation and a reading operation can be performed, and usually has a size of 4 KB/8 KB/16 KB, or the like. As shown in FIG. 2. A cell is a minimum unit that is in the page and on which an erasing/writing/reading operation can be performed, is corresponding to one floating gate transistor, and can store one or more bits.

Data reading/writing operations of the NAND flash mainly include erasing, programming (or writing), and reading. The programming operation and the reading operation are performed on a per-page basis, and the erasing operation is performed on a per-block basis.

Figure 3:
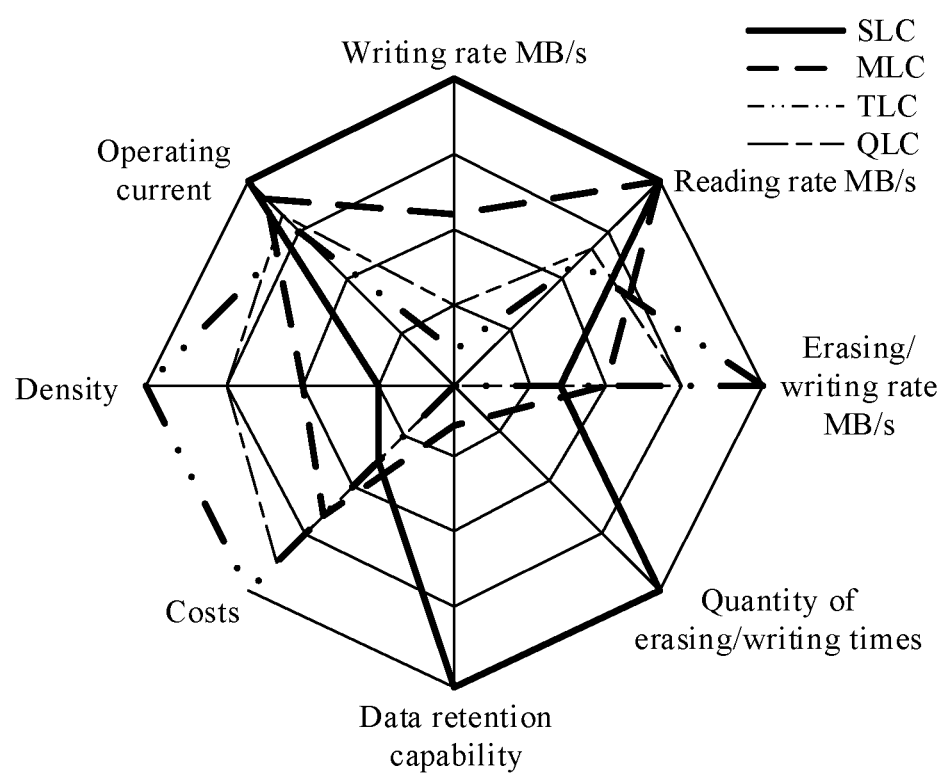
FIG. 3 is a schematic diagram of characteristics of different storage cells in a NAND flash.

In this embodiment, based on different bit data stored in the cell, storage areas in the NAND Flash may be classified into an SLC, an MLC, a TLC, a QLC, and the like. The storage areas of different structures are different in aspects such as performance and reliability. For example, as shown in FIG. 3, the storage areas of different structures are different in a reading rate, a writing rate, an erasing rate, a quantity of erasing/writing times, a data retention capability, costs, a density, and an operating current.

Figure 4:
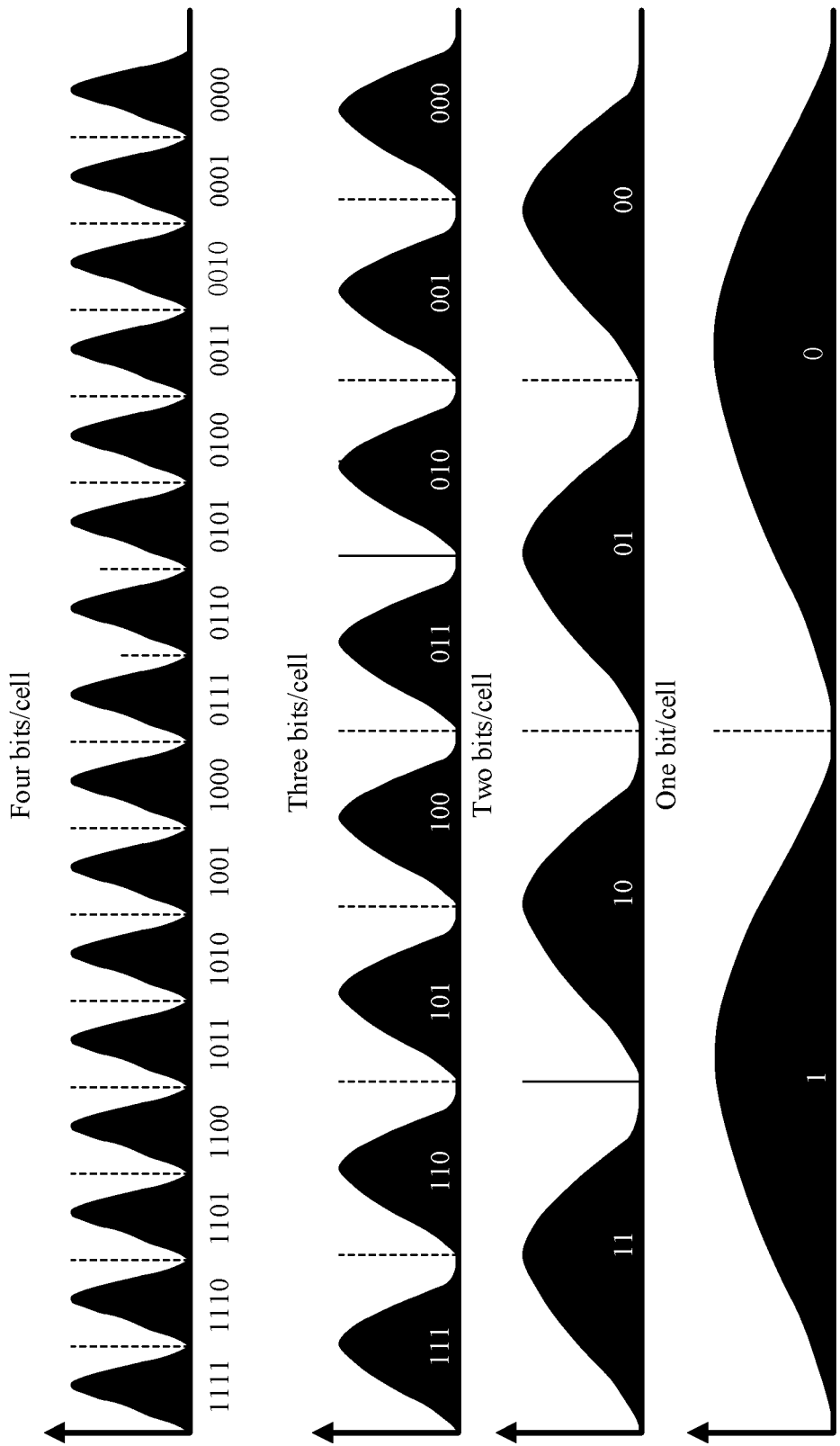
FIG. 4 is a schematic diagram of level distribution of different storage cells in a block.

Specifically, the SLC stores only 1-bit data. In other words, charges of the floating gate are differentiated by using two levels corresponding to 0 and 1, to represent one information bit, as shown in FIG. 4. A quantity of erasing times of the SLC usually is 50 K or 100 K, and the SLC has features such as a long lifetime, high performance, and a high price. The MLC may store 2-bit data, and a data density is relatively large. Four levels corresponding to 00, 01, 10, and 11 in the floating gate may represent two information bits. A quantity of erasing/writing times of the MLC usually is approximately 3 K, and the MLC has features such as a relatively short lifetime, relatively low performance, and a relatively low price. The TLC may store 3-bit data, and a data density is larger. Eight levels corresponding to 000, 001, 010, 011, 100, 101, 110, and 111 in the floating gate may represent three information bits. Erasing/writing can usually be performed on the TLC for hundreds of times. The TLC has features such as a short lifetime, low performance, and a low price. The QLC may store 4-bit data. 16 levels corresponding to 0000, 0001, 0010, 0011, 0100, 0101, 0110, 0111, 1000, 1001, 1010, 1011, 1100, 1101, 1110, and 1111 in the floating gate may represent four information bits. Usually, performance of the QLC is poorer than the performance of the TLC.

In many cases, in a 16 nm MLC, three pages in one block share a set of storage space. As shown in FIG. 5, a page 48, a page 49, and a page 112 share a set of storage space. Further, the pages sharing the set of storage space may be divided into three types. The page 48 is corresponding to a least significant bit LSB page, the page 49 is corresponding to a central significant bit CSB page, and the page 112 is corresponding to a most significant bit MSB page. The LSB page has a read latency of 40 µs and has a strongest data retention capability, the CSB page has a read latency of 70 µs and has a second strongest data retention capability, and the MSB page has a read latency of 112 µs and has a weaker data retention capability.

Figure 6:
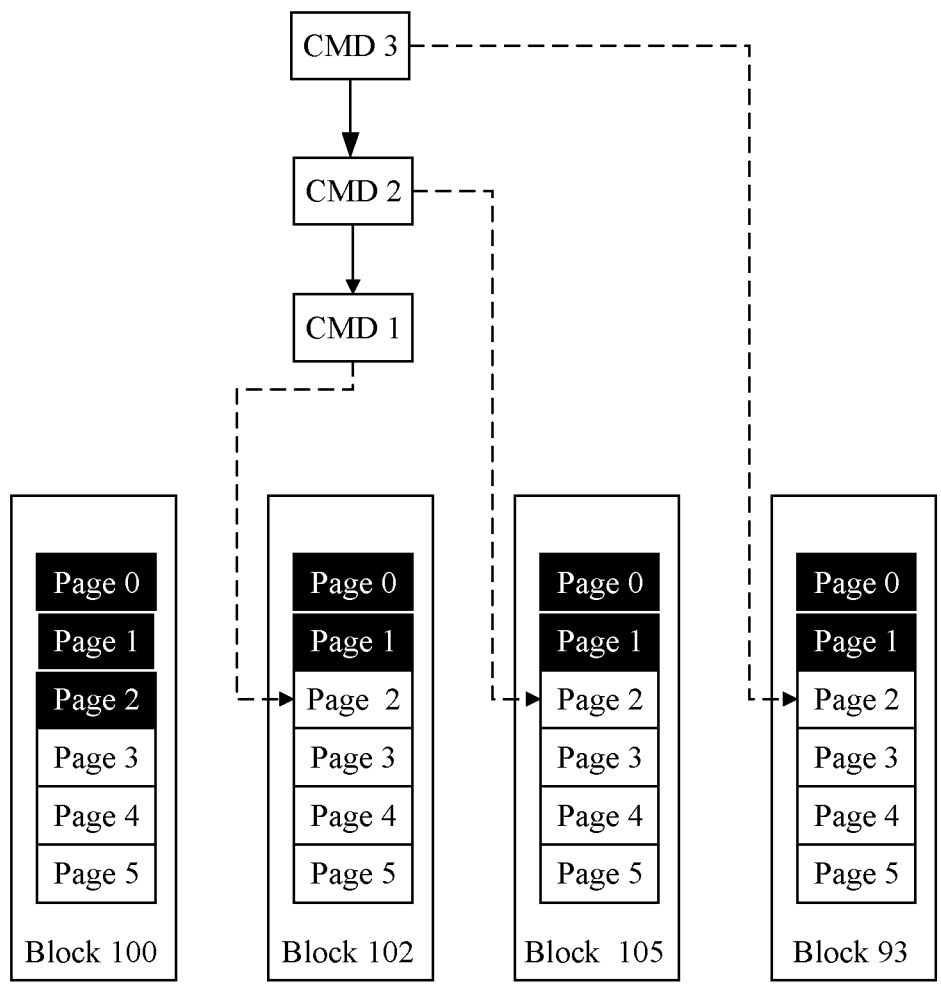
FIG. 6 is a schematic diagram of data storage of a current NAND flash.

Currently, the NAND flash stores data in a plurality of blocks based on a receiving sequence, to improve concurrency. As shown in FIG. 6, the NAND flash sequentially stores data based on a sequence of receiving the data. To be specific, the NAND flash sequentially stores data according to a write command (CMD) 1, a CMD 2, and a CMD 3. The data is randomly stored in each page in the blocks. However, because different pages are different in data storage performance, in a current storage method, a storage device is less efficient at storing data of applications with different processing requirements.

Figure 7:
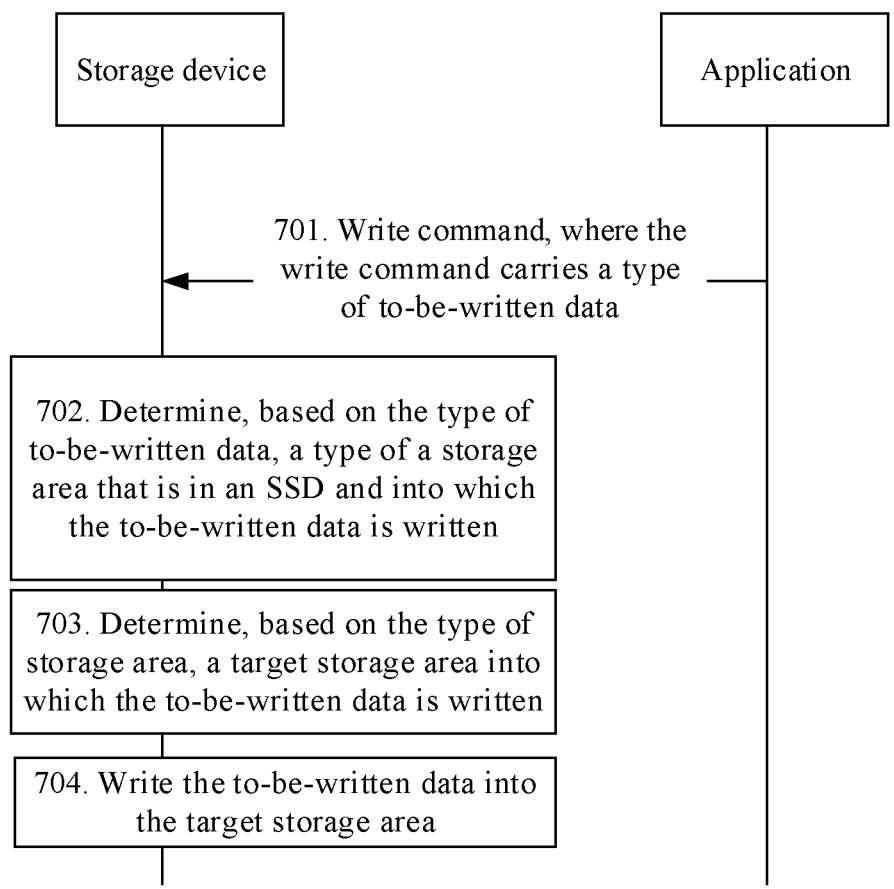
FIG. 7 is a schematic flowchart of a data writing method according to an embodiment.

FIG. 7 is a schematic flowchart of a data writing method according to an embodiment. The method includes the following steps.

701. A storage device receives a write command sent by an upper-layer application, where the write command carries a type of to-be-written data.

The storage device in this embodiment is an SSD that includes a NAND flash.

Figures 8, 9:
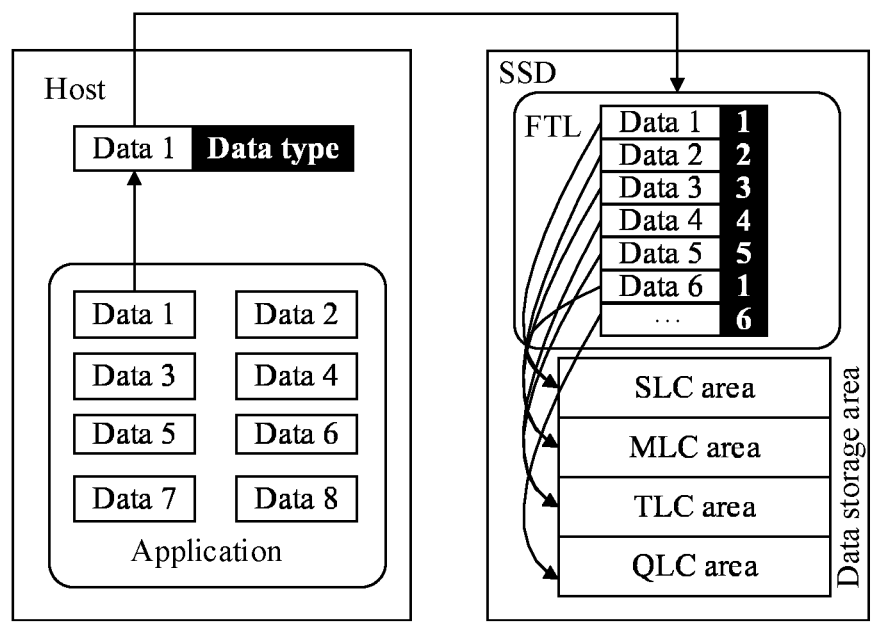
FIG. 8 shows a table of a mapping relationship between values of bits and latencies according to an embodiment.
FIG. 9 is a schematic diagram of data storage according to an embodiment.

The storage device communicates, by using a NVM Express (NVMe) protocol, with a host at which the upper-layer application is located, and a write command defined in the NVMe protocol carries the type of to-be-written data. In this embodiment, the type of to-be-written data is identified by using a write latency requirement of a write request. Specifically, as shown in FIG. 8, a write latency field is defined in the write command in NVMe. In the write latency field, different latency requirements are defined, and the latency requirements of the write command respectively are identified by using 00b, 01b, 10b, and 11b. 00b indicates that the write request does not require a latency (no latency information provided). In other words, an application has no time length requirement for writing the data. 01b indicates that the write request may accept a longer latency (longer latency acceptable). In other words, the application may accept a longer time length of writing the data. 10b represents a typical latency. In other words, for the application, a required time length of writing the data is a relatively typical time length. 11b represents a smallest possible latency. In other words, the application requires a relatively short time length of writing the data. When delivering the command, the upper-layer application may select one of the latency requirements to represent the type of to-be-written data.

It should be noted that the write command further carries a logical address of the to-be-written data and a length of the to-be-written data.

702. The storage device determines, based on the type of to-be-written data carried in the write command, a type of storage area that is in an SSD and into which the to-be-written data is written.

In an embodiment, the storage device may determine, based on the type of to-be-written data and a correspondence that is stored in the SSD and that is between the data type and the storage area type, a type of target storage area into which the to-be-written data is written.

Specifically, the storage device may directly determine, based on the type of to-be-written data and the correspondence, the target storage area where the to-be-written data is written, or may indirectly determine the target storage area where the to-be-written data is written.

For example, if there is the type of to-be-written data in a correspondence, a storage area type corresponding to the type of to-be-written data in the correspondence may be determined as the type of target storage area. If there is no type of to-be-written data in a correspondence, a storage area type corresponding to another type similar to the type of to-be-written data may be determined as the type of target storage area.

Optionally, in blocks included in storage areas corresponding to different storage area types, different bits are used to store data.

For example, the storage area may be a single level storage cell SLC area in which 2 bits are used to store data, or may be a multi-level storage cell MLC area in which 4 bits are used to store data, or may be a triple level storage cell TLC area in which 8 bits are used to store data, or may be a quad level storage cell QLC area in which 16 bits are used to store data.

It should be understood that the storage area may be another storage area in which more than 16 bits are used to store data. This is not limited in this disclosure.

In another embodiment, the SSD includes a plurality of storage blocks, the SSD is divided into different types of storage areas based on types of the storage blocks, and the correspondence is a correspondence between the data type and a storage block type.

Specifically, the storage device includes the different types of storage areas, and the different types of storage areas are different in storage performance. In the storage device, a mapping relationship between the type of to-be-written data and a storage block type may be preset. For example, a storage block type corresponding to 00b in the write latency field may be configured as the SLC storage area, a storage block type corresponding to 01b may be configured as the MLC storage area, a storage block type corresponding to 10b may be configured as the TLC storage area, and a storage block type corresponding to 11b may be configured as the QLC storage area. In this way, after receiving the write command, the storage device may determine, based on the type of to-be-written data in the write command, a type of storage block into which the to-be-written data is written.

For example, the SSD may include at least one of the SLC storage area, the MLC storage area, the TLC storage area, and the QLC storage area. All cells included in one block may be of a same type, and blocks of a same type form a type of storage area. For example, a plurality of blocks of an SLC type form an SLC storage area, a plurality of blocks of an MLC type form an MLC storage area, and blocks of a TLC type form a TLC storage area.

As shown in FIG. 9, an application in a host stores to-be-written data in a storage area of an SSD. Storage areas may be divided into four levels of areas: an SLC area, an MLC area, a TLC area, and a QLC area.

It should be noted that performance of the SLC area, the MLC area, the TLC area, and the QLC area can be sorted based on data processing efficiency, reliability, or the like. For example, compared with the other three types of areas, the SLC area has highest data processing efficiency, and performance of the area may be considered to be the highest.

It should be understood that, in the following embodiments, a storage area obtained through division performed on a per-block basis may be referred to as "a block storage area".

703. Determine, based on the type of storage area, a target storage area into which the to-be-written data is written.

After the type of storage area into which the to-be-written data is written is determined, the to-be-written data may be written into an idle area in the storage area selected from the corresponding type of storage area. For example, at least one idle block in block storage areas of the type of storage area that is in the SSD and into which the to-be-written data is written is used as the target storage area.

Optionally, if there is no idle block in the storage area of the type of storage area that is in the SSD and into which the to-be-written data is written, the storage device may convert a type of block in another type of storage area to a type that is the same as that of a block included in the storage area of the type of the storage area that is in the SSD and into which the to-be-written data is written.

For example, some blocks in the MLC area, the TLC area, or the QLC area may be converted to blocks of an SLC type, to improve storage performance.

Optionally, the storage device may reduce storage volumes of some blocks in the MLC area, the TLC area, or the QLC area, to improve storage performance of the some blocks. For example, the storage device may reduce storage volumes of some blocks in the MLC area, and then convert the some blocks to blocks of the SLC type.

704. The storage device writes the to-be-written data into the target storage area.

Optionally, after determining the target storage area, the storage device may return acknowledgement information to the application. The application may send the to-be-written data to the storage device, and the storage device stores the to-be-written data in the target storage area after receiving the to-be-written data.

Optionally, the storage device may further receive a read command. The read command is used as a request to read data, and the read command carries a type of data that is to be read as required. Further, a scheduling type of data that is to be read as required is determined based on the type of data.

Specifically, the storage device places the read commands in different scheduling queues based on types of data carried in the read commands. The storage device preferably schedules a type of data whose priority level is high, and stores the type of data whose priority level is high in a type of storage area whose priority level is high. In this way, a read response time is shorter, and a requirement of the application is further met.

Figure 10:
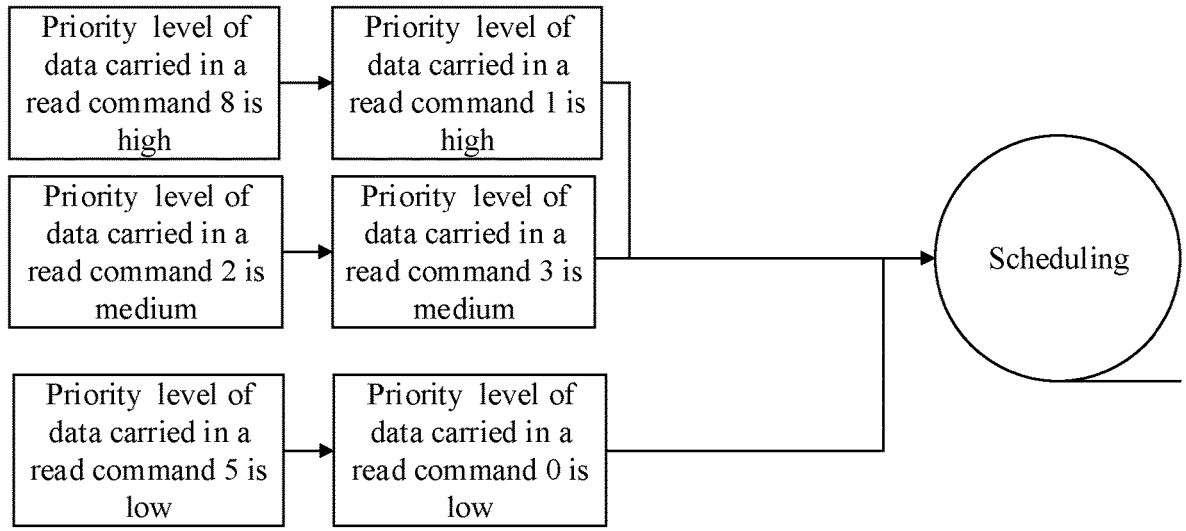
FIG. 10 is a schematic diagram of data reading according to another embodiment.

For example, as shown in FIG. 10, if a read command 8 and a read command 1 carry a type of data whose priority level is high, a read command 2 and a read command 3 carry a type of data whose priority level is medium, and a read command 5 and a read command 0 carry a type of data whose priority level is low, the storage device may preferably schedule the read command 8 and the read command 1, then schedule the read command 2 and the read command 3, and finally schedule the read command 5 and the read command 0.

Therefore, in the data writing method in this embodiment, the storage device receives the write command that carries the type of to-be-written data, determines, based on the type of to-be-written data, the type of storage block into which the to-be-written data is written, and then determines, based on the type of storage block, a target storage block into which the to-be-written data is written. In this way, the storage device can store the data in a proper storage block. In other words, the storage device can meet different requirements of applications. Therefore, data processing efficiency and system performance are improved.

Figure 11:
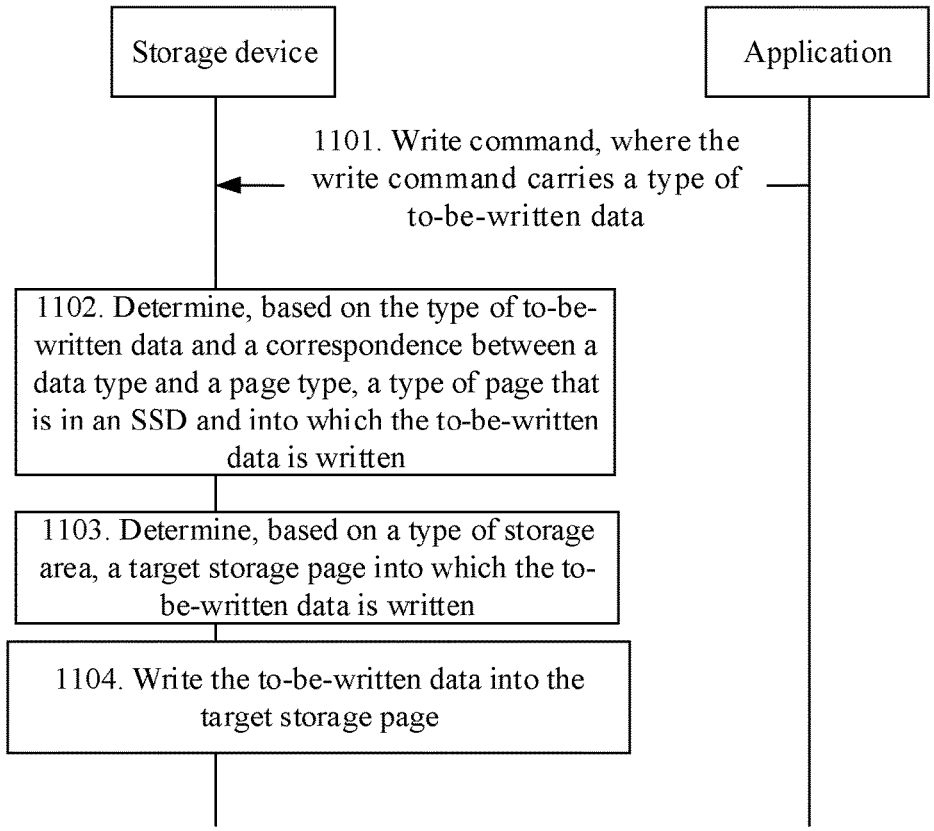
FIG. 11 is a schematic flowchart of a data writing method according to another embodiment.

FIG. 11 is a schematic flowchart of a data writing method according to another embodiment.

1101. A storage device receives a write command sent by an upper-layer application, where the write command carries a type of to-be-written data.

It should be understood that implementation of this step may be the same as that of step 701 in the foregoing embodiment. To avoid repetition, details are not described herein again.

1102. The storage device determines, based on the type of to-be-written data carried in the write command, a type of storage area into which the to-be-written data is written.

In an embodiment, the storage device may determine, based on the type of to-be-written data and a correspondence that is stored in the SSD and that is between the data type and the storage area type, a type of target storage area into which the to-be-written data is written.

Optionally, pages in blocks included in storage areas corresponding to different storage area types are different in a read latency, a write latency, and/or read/write reliability.

In another embodiment, the SSD includes different types of storage blocks, such as an SLC storage block, an MLC storage block, and a TLC storage block. Each type of storage block may further include different types of storage pages. For example, the SLC storage block includes at least one of an LSB page, a CSB page, and an MSB page. In this embodiment, the storage area type of storage device is a storage page type.

Specifically, the SSD may include an LSB page, a CSB page, and an MSB page. The LSB Page has lowest storage performance, the CSB page has higher storage performance than the LSB page, and storage performance of the most significant bit MSB page is higher than the storage performance of the CSB page. In the storage device, a mapping relationship between the data type of to-be-written data and a storage page type may be preset. For example, a page type corresponding to 00b and 01b in the write latency field may be configured as the LSB page, a page type corresponding to 10b may be configured as the CSB page, and a page type corresponding to 11b may be configured as the MSB page. In this way, after receiving the write command, the storage device may determine, based on the type of to-be-written data in the write command, a type of page into which the to-be-written data is written. In other words, the storage device can write the to-be-written data into a proper page. Therefore, data storage performance is improved.

Optionally, the page may be the least significant bit LSB page, the central significant bit CSB page, the most significant bit MSB page, or another page.

Specifically, the storage device may divide a storage area into pages with at least two performance levels based on performance and reliability. The least significant bit LSB page has lowest performance, the central significant bit CSB page has higher performance than the LSB page, and performance of the most significant bit MSB page is higher than the performance of the CSB page. In this way, the storage device may select a corresponding page type based on a correspondence between the type of to-be-written data and the page type. Therefore, the storage device can better serve at least two applications having different requirements. In this way, system performance is improved.

For example, as shown in FIG. 9, four storage areas: an SLC area, an MLC area, a TLC area, and a QLC area in a storage area may be replaced with three types of areas: an LSB page, a CSB page, and an MSB page.

It should be understood that each block may include different types of pages.

1103. The storage device determines, based on the type of storage area, the target storage area into which the to-be-written data is written.

After the type of storage area into which the to-be-written data is written is determined, the to-be-written data may be written into an idle area in the storage area selected from the corresponding type of storage area. For example, at least one idle page corresponding to a page type corresponding to the type of the storage area that is in the SSD and into which the to-be-written data is written is used as the target storage area.

Optionally, different types of each storage pages may be corresponding to one storage list, and each storage list records one type of storage page. The storage device may find, based on a storage page type, an idle storage page in a storage list corresponding to the storage page type, and use the idle storage page as the target storage area. If there is an available storage page in the storage list, the storage device may use the available storage page as the target storage area, and write the to-be-written data into the available storage page. If there is no available storage page in the storage list, an idle storage block is obtained from the SSD, and the storage device uses a first storage page in the idle storage block as the target storage area, and writes the to-be-written data into the first storage page.

After completing writing of the to-be-written data in a current storage page, the storage device adds a next storage page to a corresponding storage list. For example, if there is an available storage page in the storage list, the storage device adds a next page of the available storage page to the storage list after completing data writing. If there is no available storage page in the storage list, after writing data into a first storage page, the storage device adds a second storage page to the storage list.

It should be understood that in this embodiment, the storage list may be referred to as a "stack". For example, a storage list corresponding to an LSB page type is referred to as an "LSB stack", a storage list corresponding to a CSB page type is referred to as a "CSB stack", and a storage list corresponding to an MSB page type is referred to as an "MSB stack".

Figure 12:
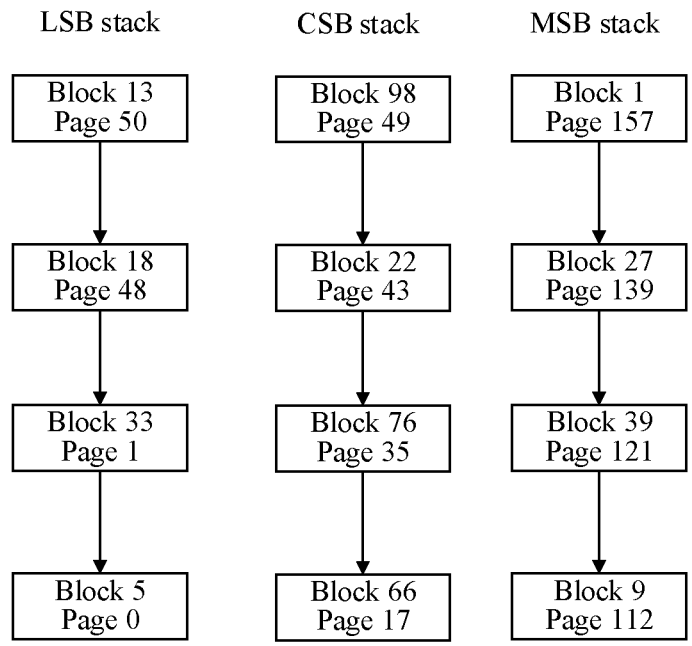
FIG. 12 is a schematic diagram of a data writing method according to another embodiment.
Figure 13:
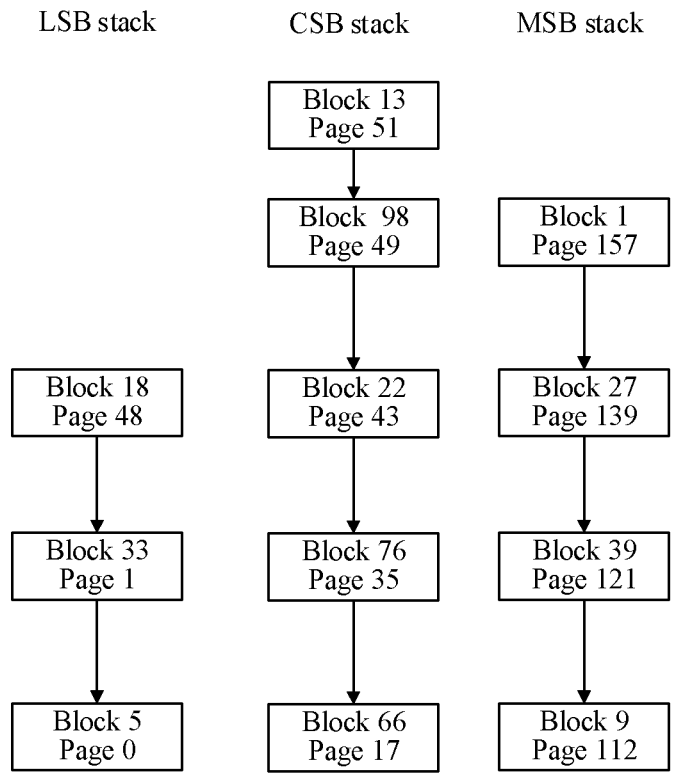
FIG. 13 is a schematic diagram of a data writing method according to another embodiment.

For example, as shown in FIG. 12 and FIG. 13, the storage device may divide a block storage area into three types of pages. Specifically, in FIG. 12, the storage device may respectively attach a plurality of pages to areas of corresponding types. The storage device attaches Block 13 Page 50, Block 18 Page 48, Block 33 Page 1, and Block 5 Page 0 to the LSB stack, attaches Block 98 Page 49, Block 22 Page 43, Block 76 Page 35, and Block 66 Page 17 to the CSB stack, and attaches Block 1 Page 157, Block 27 Page 139, Block 39 Page 121, and Block 9 Page 112 to the MSB stack. The storage device may store the to-be-written data in at least one idle page in a corresponding stack based on the type of to-be-written data.

Optionally, the storage device records currently available pages in a block in different storage lists.

Specifically, the pages in the block are sequentially numbered, and the storage device stores data based on a page sequence. To be specific, if a page 48 in a block is not used, a page 49 cannot directly be used for data storage.

The storage device records a currently available page in a storage list. If there is a page into which data is being written in a block of the storage device, another page in the block is an unavailable page. After the storage device completes writing of the page, the storage device may store a next page in the corresponding storage list.

For example, different types of pages (an LSB page, a CSB page, and an MSB page) may alternately occur. Pages in a block 18 shown in FIG. 5 are used as an example for description. After data is stored in Block 18 Page 48 in an LSB area, following data needs to be stored in Block 18 Page 50; however, Block 18 Page 49 belongs to a CSB area, and if no data is stored in Block 18 Page 49, data may not be directly stored in Block 18 Page 50 belonging to the LSB area. In this way, the storage device can attach, to the CSB stack, Block 18 Page 49 that can be used for data storage, and then, Block 18 Page 49 can be used to write data.

It should be noted that in this embodiment, a page that cannot be used for data storage is not stored in the storage list.

It should be understood that available pages of a same type in different blocks are stored in a same storage list.

Optionally, if there is no available page in a storage list corresponding to the page type corresponding to the type of storage area that is in the SSD and into which the to-be-written data is written, the storage device may find a new block, attach a page 0 to the corresponding storage list, and then start storing data.

Optionally, if there is no available page in the storage list corresponding to the page type corresponding to the type of storage area that is in the SSD and into which the to-be-written data is written, the storage device may determine a page having higher performance as the target storage area. In other words, the data is processed by using the page having higher performance. In this way, a resource can be fully used, and data congestion caused because the data waits for a proper storage area is avoided.

For example, if a page type corresponding to the type of storage area that is in the SSD and into which the to-be-written data is written is an MSB page, and there is no idle page in a storage list corresponding to the MSB page, the storage device may determine at least one available page in a CSB page as the target storage area, or determine at least one available page in an LSB page as the target storage area. If a storage area of the type of storage area that is in the SSD and into which the to-be-written data is written is a CSB page, and there is no idle page in the CSB page, the storage device determines at least one idle page in the LSB page as the target storage area.

It should be understood that the storage device may also determine a page having lower performance as the target storage area. In this way, data processing efficiency can also be improved when there is no idle storage area in a page having higher performance. This is not limited in this disclosure.

Optionally, the storage device may determine, based on the type of to-be-written data, both an idle block that meets a requirement of the to-be-written data and an idle page that meets the requirement of the to-be-written data. For example, the storage device may use, as the target storage area, at least one page that belongs to an LSB page area and that is in a block in an MLC area.

Optionally, when the storage device determines the target storage area in a storage area based on the type of to-be-written data, an area of an update type in the storage area may be selected based on the type of to-be-written data, and at least one page in the area of the update type of the type of storage area that is in the SSD and into which the to-be-written data is written is used as the target storage area. Storage areas include areas of at least two update types, and storage data in any two of the areas of the at least two update types is updated at different frequencies.

Specifically, the storage device divides the storage areas into a plurality of storage areas of a plurality of update types based on frequencies of updating storage data. Because the storage device has limited time to store data, the storage device may select, based on the type of to-be-written data, a proper area of an update type to store the data. For example, the storage device may preset a mapping relationship between the type of to-be-written data and an update type of an area, and the storage device may determine the area of the update type based on the mapping relationship and the type of to-be-written data. In this way, impact on system performance that is caused by frequent data inspection and updating caused because an improper area of an update type is selected is avoided, or reduction in data reliability that is caused by an excessively low inspection and updating rate is avoided. Therefore, in this embodiment, reliability of different data can be implemented without affecting system performance.

For example, as shown in FIG. 9, the four storage areas: the SLC area, the MLC area, the TLC area, and the QLC area in the storage area may be replaced with the areas of the plurality of update types.

It should be understood that an area of each update type may be a page, or may be any one of a device, a target, a LUN, a plane, and a block. This is not limited in this disclosure.

It should also be understood that the areas of the plurality of update types may have a same capacity, or some areas of the update types may have different capacities, or all the areas of the update types may have different capacities.

Optionally, the storage device may also use at least two of the three types of storage areas: the block storage area, the page, and the area of the update type as target storage areas. For example, the storage device may use at least one page that belongs to not only an LSB page but also an area of an update type in a block in the MLC area as the target storage area.

1104. The storage device writes the to-be-written data into the target storage area.

Therefore, in the data writing method in this embodiment, the storage device receives the write command that carries the type of to-be-written data, determines, based on the type of to-be-written data, the type of storage page into which the to-be-written data is written, and then determines, based on the type of storage page, a target storage page into which the to-be-written data is written. In this way, the storage device can store the data in a proper storage page. In other words, the storage device can meet different requirements of applications. Therefore, data processing efficiency and system performance are improved.

Figure 14:
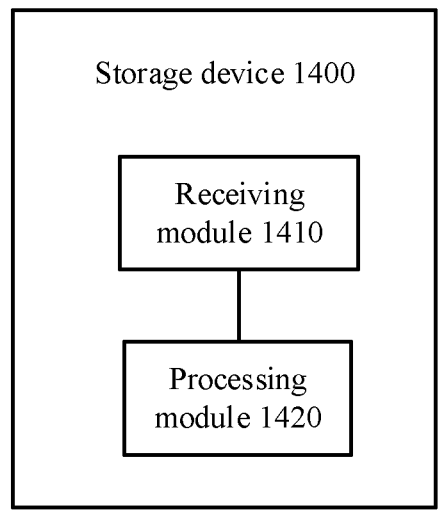
FIG. 14 is a schematic block diagram of a storage device according to an embodiment.

FIG. 14 is a schematic block diagram of a storage device 1400 according to an embodiment. As shown in FIG. 14, the storage device 1400 includes a receiving module 1410 and a processing module 1420.

The receiving module 1410 is configured to receive a write command, where the write command carries a type of to-be-written data.

The processing module 1420 is configured to determine, based on the type of to-be-written data, a type of storage area that is in the SSD and into which the to-be-written data is written, where the SSD includes a plurality of types of storage areas.

The processing module 1420 is further configured to determine, based on the type of storage area, a target storage area into which the to-be-written data is written.

The processing module 1420 is further configured to write the to-be-written data into the target storage area.

Optionally, the SSD stores a correspondence between a data type and a storage area type, and the processing module 1420 is further configured to: determine, based on the type of to-be-written data and the correspondence, a type of target storage area into which the to-be-written data is written.

Optionally, the SSD includes a plurality of storage blocks, the SSD is divided into different types of storage areas based on types of the storage blocks, and the correspondence is a correspondence between the data type and a storage block type.

Optionally, the SSD includes a plurality of storage blocks, each storage block includes at least one type of storage page, the SSD is divided into different types of storage areas based on storage page types, and the correspondence is a correspondence between the data type and the storage page type.

Optionally, different types of each storage pages are corresponding to one storage list, and each storage list records one type of storage page.

The processing module 1420 is further configured to: find, based on a storage page type, an available storage page in a storage list corresponding to the storage page type, and use the available storage page as the target storage area; and if there is an available storage page in the storage list, use the available storage page as the target storage area; or if there is no available storage page in the storage list, obtain an idle storage block in the SSD, and use a first storage page in the idle storage block as the target storage area.

Optionally, the SSD includes at least two of an SLC area, an MLC area, a TLC area, and a QLC area, performance of the SLC area, the MLC area, the TLC area, and the QLC area sequentially decreases, and if there is no idle storage page in all storage blocks in a storage area corresponding to the type of storage area that is in the SSD and into which the to-be-written data is written, the processing module 1420 converts a type of at least one block that includes an idle storage page and that is in a storage area having lower performance than the type of storage area that is in the SSD and into which the to-be-written data is written to a type that is the same as a type of storage area of the type of storage area that is in the SSD and into which the to-be-written data is written.

Optionally, the storage block includes at least two of an LSB page, a CSB page, and the MSB page, performance of the LSB page, the CSB page, and the MSB page sequentially decreases, and the processing module 1420 is further configured to: if a storage area of the type of storage area that is in the SSD and into which the to-be-written data is written is the MSB page or the CSB page, and there is no available storage page in the storage area of the type of storage area that is in the SSD and into which the to-be-written data is written, determine, as the target storage area, at least one available storage page having higher performance than the type of storage area that is in the SSD and into which the to-be-written data is written.

Therefore, the storage device in this embodiment receives the write command that carries the type of to-be-written data, determines, based on the type of to-be-written data, the type of storage area into which the to-be-written data is written, and then determines, based on the type of storage area, the target storage area into which the to-be-written data is written. In this way, the storage device can store the data in a proper storage area. In other words, the storage device can meet different requirements of applications. Therefore, data processing efficiency and system performance are improved.

It should be understood that the storage device 1400 in this embodiment may be corresponding to the storage device in the data writing method in the embodiment shown in FIG. 7, and the foregoing and other management operations and/or functions of the modules in the storage device 1400 are separately used to implement corresponding steps of the foregoing methods. For brevity, details are not described herein again.

Figure 15:
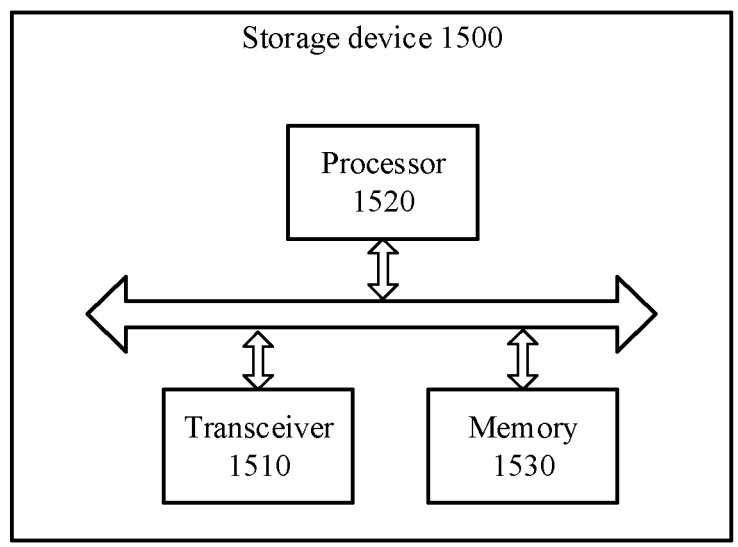
FIG. 15 is a schematic structural diagram of a storage device according to an embodiment.

In this embodiment, the receiving module 1410 may be implemented by a transceiver, and the processing module 1420 may be implemented by a processor. As shown in FIG. 15, the storage device 1500 may include a transceiver 1510, a processor 1520, and a memory 1530. The memory 1530 may be configured to store indication information, and may be further configured to store code, an instruction, and the like executed by the processor 1520.

It should be understood that the processor 1520 may be an integrated circuit chip and has a signal processing capability. In an implementation process, steps in the foregoing method embodiments can be implemented by using a hardware integrated logical circuit in the processor, or by using instructions in a form of software. The processor may be a general purpose processor, a digital signal processor (DSP), an application-specific integrated circuit (ASIC), a field-programmable gate array (FPGA), or another programmable logical device, a discrete gate or transistor logic device, or a discrete hardware component. The processor may implement or perform the methods, the steps, and logical block diagrams that are disclosed in the embodiments. The general purpose processor may be a microprocessor, or the processor may be any conventional processor or the like. Steps of the methods disclosed with reference to the embodiments may be directly executed and accomplished by using a hardware decoding processor, or may be executed and accomplished by using a combination of hardware and software modules in the decoding processor. A software module may be located in a mature storage medium in the art, such as a random access memory, a flash memory, a read-only memory, a programmable read-only memory, an electrically erasable programmable memory, a register, or the like. The storage medium is located in the memory, and a processor reads information in the memory and completes the steps in the foregoing methods in combination with hardware of the processor.

It may be understood that the memory 1530 may be a volatile memory or a nonvolatile memory, or may include a volatile memory and a nonvolatile memory. The nonvolatile memory may be a read-only memory (ROM), a programmable ROM (PROM), an erasable PROM (EPROM), an electrically erasable PROM (EEPROM), or a flash memory. The volatile memory may be a random-access memory (RAM), used as an external cache. Through example but not limitative description, many forms of RAMs may be used, for example, a static RAM (SRAM), a dynamic RAM (DRAM), a synchronous DRAM (SDRAM), a double data rate SDRAM (DDR SDRAM), an enhanced SDRAM (ESDRAM), a SynchLink DRAM (SLDRAM), and a direct Rambus RAM (DR RAM).

It should be noted that the memory described in the embodiments is intended to include but not limited to these memories and any memory of another proper type.

The embodiments further provide a computer storage medium, and the computer storage medium may store a program instruction for performing any of the foregoing methods.

Optionally, the storage medium may be specifically the memory 1530.

The embodiments further provide a system chip. The system chip includes an input/output interface, at least one processor, at least one memory, and a bus. The at least one memory is configured to store an instruction, and the at least one processor is configured to invoke the instruction in the at least one memory to perform an operation of the method in the foregoing embodiments.

The processor included in the system chip in the embodiments is configured to support a distributed unit, a centralized unit, and a storage device in implementing functions in the foregoing embodiments, for example, a function of generating or processing data and/or information in the foregoing methods.

In a possible design, the memory of the chip system is configured to store a necessary program instruction and necessary data in a distributed unit, a centralized unit, and a terminal device. The chip system may include a chip, or may include a chip and another discrete device. It should be understood that data and/or information processed by the chip may be from an application, and processed data and/or processed information may also be sent to the application. This is not limited in this disclosure.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this disclosure.

It may be clearly understood by a person skilled in the art that, for the purpose of convenient and brief description, for a detailed working process of the foregoing system, apparatus, and unit, refer to a corresponding process in the foregoing method embodiments. Details are not described herein again.

In the several embodiments provided, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of this disclosure may be implemented in a form of a software product. The computer software product is stored in a storage medium, and includes several instructions for instructing a computer device (which may be a personal computer, a server, or a network device) to perform all or some of the steps of the methods described in the embodiments. The foregoing storage medium includes: any medium that can store program code, such as a USB flash drive, a removable hard disk, a ROM, a RAM, a magnetic disk, or an optical disc.

The foregoing descriptions are merely specific implementations, but are not intended to limit the protection scope of this disclosure. Any variation or replacement readily figured out by a person skilled in the art within the technical scope disclosed shall fall within the protection scope of this disclosure. Therefore, the protection scope of this disclosure shall be subject to the protection scope of the claims.

What is claimed is:

1. A method implemented by a solid-state device (SSD) and comprising:
   receiving data to be written into the SSD, wherein the SSD comprises storage areas of different storage types, wherein the storage areas comprise a first storage area of a first storage type;
   determining, based on a data type that is of the data and that is identified by a write latency requirement, to write the data into the first storage area; and
   writing the data into the first storage area.

2. The method of claim 1, further comprising further determining to write the data into the first storage area based on a correspondence between the data type and the first storage type.

3. The method of claim 2, wherein the storage areas comprise storage blocks of different block types, and wherein the correspondence is further between the data type and a first block type of the block types.

4. The method according to claim 3, wherein the storage areas further comprise single-level cell (SLC) areas, a multi-level cell (MLC) area, a triple-level cell (TLC) area, and a quad-level cell (QLC) area, and wherein first performances of the SLC areas are greater than a second performance of the MLC area, the second performance is greater than a third performance of the TLC area, and the third performance is greater than a fourth performance of the QLC area.

5. The method of claim 3, further comprising converting, when there is no idle storage page in the first storage area, at least one block comprising an idle storage page in a second storage area of a second storage type to the first storage type, wherein a second performance of the second storage area is lower than a first performance of the first storage area.

6. The method of claim 2, wherein the SSD further comprises storage blocks, wherein the storage blocks comprise storage pages of different storage page types, and wherein the correspondence is further between the data type and a first storage page type of the storage page types.

7. The method of claim 6, further comprising:
determining, when there is an available storage page in the first storage area, the available storage page as a target storage area; or
when there is no available storage page in the first storage area, obtaining an idle storage block in the SSD and determining a first storage page in the idle storage block as the target storage area.

8. The method of claim 6, wherein the storage pages comprise least significant bit (LSB) pages, a central significant bit (CSB) page, and a most significant bit (MSB) page, wherein a first performance of the LSB pages is greater than a second performance of the CSB page and the second performance is greater than a third performance of the MSB page, and wherein the method further comprises determining, when a storage area of the first storage type is the MSB page or the CSB page and when there is no available storage page in the storage area, as a target storage area, at least one available storage page having higher performance than the storage area in the first storage type.

9. The method of claim 1, further comprising receiving a write request or a write command comprising the write latency requirement.

10. The method of claim 9, further comprising further receiving the write request or the write command from an upper-layer application.

11. The method of claim 9, wherein the write request or the write command is defined by a Non-Volatile Memory Express (NVMe) control protocol.

12. The method of claim 1, wherein the data type is based on priority.

13. A solid-state device (SSD) comprising:
a storage medium comprising storage areas of different storage types, wherein the storage areas comprise a first storage area of a first storage type;
a controller coupled to the storage medium and configured to:
receive data to be written into the SSD;
determine, based on a data type that is of the data and that is identified by a write latency requirement, to write the data into the first storage area; and
write the data into the first storage area.

14. The SSD of claim 13, wherein the controller is further configured to further determine to write the data in to the first storage area based on a correspondence between the data type and the first storage type.

15. The SSD of claim 14, wherein the storage areas comprise storage blocks of different block types, and wherein the correspondence is further between the data type and a first block type of the block types.

16. The SSD of claim 15, wherein the storage areas further comprise single-level cell (SLC) areas, a multi-level cell (MLC) area, a triple-level cell (TLC) area, and a quad-level cell (QLC) area, and wherein first performances of the SLC areas are greater than a second performance of the MLC area, the second performance is greater than a third performance of the TLC area, and the third performance is greater than a fourth performance of the QLC area.

17. The SSD of claim 15, wherein the controller is further configured to convert, when there is no idle storage page in the first storage area, at least one block comprising an idle storage page in a second storage area of a second storage type to the first storage type, and wherein a second performance of the second storage area is lower than a first performance of the first storage area.

18. The SSD of claim 14, wherein the storage medium further comprises storage blocks, wherein the storage blocks comprise storage pages of different storage page types, and wherein the correspondence is further between the data type and a first storage page type of the storage page types.

19. The SSD of claim 18, wherein the controller is further configured to:
determine, when there is an available storage page in the first storage area, the available storage page as a target storage area; or
when there is no available storage page in the first storage area, obtain an idle storage block in the SSD and determine a first storage page in the idle storage block as the target storage area.

20. The SSD of claim 18, wherein the storage blocks comprise least significant bit (LSB) pages, a central significant bit (CSB) page, and a most significant bit (MSB) page, wherein a first performance of the LSB pages is greater than a second performance of the CSB page and the second performance is greater than a third performance of the MSB page, and wherein the controller is further configured to determine, when a storage area of the first storage type is the MSB page or the CSB page and when there is no available storage page in the storage area, as a target storage area, at least one available storage page having higher performance than the storage area in the first storage type.

21. A storage system comprising:
a host configured to send data to be written; and
a solid-state device (SSD) coupled to the host and comprising storage areas of different storage types, wherein the storage areas comprise a first storage area of a first storage type, and wherein the SSD is configured to:
receive the data from the host;
determine, based on a data type that is of the data and that is identified by a write latency requirement, to write the data into the first storage area; and
write the data into the first storage area.

22. The storage system of claim 21, wherein the SSD is further configured to further determine to write the data into the first storage area based on a correspondence between the data type and the first storage type.

23. The storage system of claim 22, wherein the storage areas comprise single-level cell (SLC) area, a multi-level cell (MLC) area, a triple-level cell (TLC) area, and a quad-level cell (QLC) area, and wherein first performances of the SLC area are greater than a second performance of the MLC area, the second performance is greater than a third performance of the TLC area, and the third performance is greater than a fourth performance of the QLC area.

24. The storage system of claim 22, wherein the SSD comprises a plurality of storage blocks, each storage block comprises at least one type of storage page, and the correspondence is a correspondence between the data type and a storage page type, and wherein the SSD is further configured to:
determine, when there is an available storage page in the first storage area, the available storage page as a target storage area; or
when there is no available storage page in the first storage area, obtain an idle storage block in the SSD, and determine a first storage page in the idle storage block as the target storage area.

* * * * *